(12) United States Patent
Kumar et al.

(10) Patent No.: US 11,495,440 B2
(45) Date of Patent: Nov. 8, 2022

(54) PLASMA DENSITY CONTROL ON SUBSTRATE EDGE

(71) Applicant: Applied Materials, Inc., Santa Clara, CA (US)

(72) Inventors: Bhaskar Kumar, Santa Clara, CA (US); Prashanth Kothnur, San Jose, CA (US); Sidharth Bhatia, Santa Cruz, CA (US); Anup Kumar Singh, Santa Clara, CA (US); Vivek Bharat Shah, Sunnyvale, CA (US); Ganesh Balasubramanian, Fremont, CA (US); Changgong Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 139 days.

(21) Appl. No.: 16/996,004

(22) Filed: Aug. 18, 2020

(65) Prior Publication Data
US 2020/0381222 A1     Dec. 3, 2020

Related U.S. Application Data

(63) Continuation of application No. 15/947,393, filed on Apr. 6, 2018, now Pat. No. 10,790,121.
(Continued)

(51) Int. Cl.
H01J 37/32     (2006.01)

(52) U.S. Cl.
CPC .. H01J 37/32477 (2013.01); H01J 37/32091 (2013.01); H01J 37/32385 (2013.01);
(Continued)

(58) Field of Classification Search
CPC ........... H01J 37/32477; H01J 37/32091; H01J 37/32642; H01J 37/32385; H01J 2237/3321; H01J 2237/022
See application file for complete search history.

(56) References Cited

U.S. PATENT DOCUMENTS

| 4,585,515 A | 4/1986 | Maa |
| 4,585,516 A | 4/1986 | Corn et al. |

(Continued)

FOREIGN PATENT DOCUMENTS

| JP | 06053176 | 2/1994 |
| JP | 8306663 A | 11/1996 |

(Continued)

OTHER PUBLICATIONS

PCT/US2018/026441, International Search Report dated Jul. 27, 2018, 12 pages.
(Continued)

*Primary Examiner* — Yuechuan Yu
(74) *Attorney, Agent, or Firm* — Patterson + Sheridan, LLP

(57) ABSTRACT

Embodiments of the present disclosure generally relate to apparatuses for reducing particle contamination on substrates in a plasma processing chamber. In one or more embodiments, an edge ring is provided and includes a top surface, a bottom surface opposite the top surface and extending radially outward, an outer vertical wall extending between and connected to the top surface and the bottom surface, an inner vertical wall opposite the outer vertical wall, an inner lip extending radially inward from the inner vertical wall, and an inner step disposed between and connected to the inner wall and the bottom surface. During processing, the edge ring shifts the high plasma density zone away from the edge area of the substrate to avoid depositing particles on the substrate when the plasma is de-energized.

20 Claims, 2 Drawing Sheets

US 11,495,440 B2

Page 2

Related U.S. Application Data

(60) Provisional application No. 62/482,915, filed on Apr. 7, 2017.

(52) U.S. Cl.
CPC ... *H01J 37/32642* (2013.01); *H01J 2237/022* (2013.01); *H01J 2237/3321* (2013.01)

(56) References Cited

U.S. PATENT DOCUMENTS

| | | | |
|---|---|---|---|
| 5,304,250 | A | 4/1994 | Sameshima et al. |
| 5,414,324 | A | 5/1995 | Roth et al. |
| 5,464,499 | A | 11/1995 | Moslehi et al. |
| 5,573,981 | A | 11/1996 | Sato |
| 5,688,331 | A | 11/1997 | Aruga et al. |
| 5,737,175 | A | 4/1998 | Grosshart et al. |
| 5,914,568 | A | 6/1999 | Nonaka |
| 6,110,556 | A | 8/2000 | Bang et al. |
| 6,136,214 | A | 10/2000 | Mori et al. |
| 6,488,820 | B1 | 12/2002 | Burkhart |
| 6,663,748 | B2 | 12/2003 | Kodama |
| 7,144,521 | B2 | 12/2006 | Rusu et al. |
| 7,651,586 | B2 | 1/2010 | Moriya et al. |
| 7,683,289 | B2 | 3/2010 | Dhindsa et al. |
| 8,069,817 | B2 | 12/2011 | Fischer et al. |
| 8,226,769 | B2 | 7/2012 | Matyushkin et al. |
| 8,563,619 | B2 | 10/2013 | Dhindsa et al. |
| 8,663,391 | B2 | 3/2014 | Matyushkin et al. |
| 9,275,887 | B2 | 3/2016 | Matyushkin et al. |
| 9,883,549 | B2 | 1/2018 | Matyushkin et al. |
| 10,257,887 | B2 | 4/2019 | Matyushkin et al. |
| 2002/0094591 | A1 | 7/2002 | Sill et al. |
| 2003/0121886 | A1 | 7/2003 | Strang et al. |
| 2005/0133162 | A1 | 6/2005 | Fetsuka et al. |
| 2006/0219363 | A1 | 10/2006 | Matsumoto et al. |
| 2007/0023398 | A1 | 2/2007 | Kobayashi et al. |
| 2007/0113785 | A1 | 5/2007 | Ho |
| 2007/0141729 | A1 | 6/2007 | Dhindsa et al. |
| 2007/0227663 | A1 | 10/2007 | Endoh et al. |
| 2008/0017104 | A1* | 1/2008 | Matyushkin ...... H01L 21/67109 118/58 |
| 2008/0041889 | A1 | 2/2008 | Geier |
| 2008/0084650 | A1 | 4/2008 | Balasubramanian et al. |
| 2008/0142481 | A1 | 6/2008 | White et al. |
| 2008/0180357 | A1 | 7/2008 | Kawakami et al. |
| 2009/0090695 | A1 | 4/2009 | Kadkhodayan et al. |
| 2009/0223810 | A1 | 9/2009 | Dhindsa et al. |
| 2012/0285619 | A1 | 11/2012 | Matyushkin et al. |
| 2013/0154175 | A1 | 6/2013 | Todorow et al. |
| 2013/0155568 | A1 | 6/2013 | Todorow et al. |
| 2014/0235063 | A1 | 8/2014 | McMillin et al. |
| 2014/0345803 | A1 | 11/2014 | Todorow et al. |
| 2015/0079336 | A1 | 3/2015 | Wang et al. |
| 2015/0138687 | A1 | 5/2015 | Boyd, Jr. et al. |
| 2015/0187630 | A1 | 7/2015 | Behdjat et al. |
| 2015/0262859 | A1 | 9/2015 | Balasubramanian et al. |
| 2016/0135252 | A1 | 5/2016 | Matyushkin et al. |
| 2016/0211166 | A1 | 7/2016 | Yan et al. |
| 2016/0284584 | A1 | 9/2016 | Chih-Chang et al. |
| 2018/0103508 | A1 | 4/2018 | Matyushkin et al. |
| 2018/0294146 | A1 | 10/2018 | Kumar et al. |

FOREIGN PATENT DOCUMENTS

| | | |
|---|---|---|
| JP | 10321604 A | 12/1998 |
| JP | 2000-306891 A | 11/2000 |
| JP | 2001-096931 A | 4/2001 |
| JP | 2002241945 A | 8/2002 |
| JP | 200807552 A | 2/2008 |
| KR | 20050053076 A | 6/2005 |
| KR | 20080041889 A | 5/2008 |
| KR | 101250356 B1 | 4/2013 |
| TW | 511398 B | 11/2002 |
| TW | 561515 B | 11/2003 |
| TW | 589675 B | 6/2004 |
| TW | 200520012 A | 6/2005 |
| TW | 200713389 A | 4/2007 |
| TW | 200729272 A | 8/2007 |
| TW | 200807552 A | 2/2008 |
| TW | 200920192 A | 5/2009 |

OTHER PUBLICATIONS

Taiwan Office Action for U.S. Appl. No. 98/107,031 dated Mar. 2, 2015.
Search Report for Taiwan Invention Patent Application No. 098107031, dated Aug. 18, 2014.
Machine Translation of Published Korean Application 10-2003-0086678 provided by K-PION. Available on the web at <http://kposd.kipo.go.kr:8088/up/kpion/> accessed by the Examiner on Jul. 25, 2011.
PCT Search Report PCT/US2009/031966 dated Jul. 21, 2009.

* cited by examiner

PLASMA DENSITY CONTROL ON SUBSTRATE EDGE

CROSS-REFERENCE TO RELATED APPLICATIONS

This application is a continuation of U.S. application Ser. No. 15/947,393, filed Apr. 6, 2018, which claims benefit of U.S. Appl. No. 62/482,915, filed Apr. 7, 2017, which are herein incorporated by reference.

BACKGROUND

Field

Implementations of the present disclosure generally relate to an apparatus for reducing particle contamination on substrates in a plasma processing chamber.

Description of the Related Art

Plasma-enhanced chemical vapor deposition (PECVD) process is a chemical process where electro-magnetic energy is applied to at least one precursor gas or vapor to transform the precursor into a reactive plasma. There are many advantages in using PECVD, including but not limited to lowering the temperature required to form a film, increasing the rate of formation of the film, enhancing the properties of the layers being formed. Particles of the gas or vapor ionized by the plasma diffuse through the plasma sheath and are absorbed onto the substrate to form a thin film layer. Plasma may be generated inside the processing chamber, i.e., in-situ, or in a remote plasma generator that is remotely positioned from the processing chamber. This process is widely used to deposit materials on substrates to produce high-quality and high-performance semiconductor devices.

Particle contamination during plasma processes such as PECVD is a major impediment to the deposition and etching of thin films during the production of these semiconductor devices. Therefore, improved apparatus are needed for reducing particle contamination in a plasma processing chamber.

SUMMARY

Implementations of the present disclosure generally relate to an apparatus for reducing particle contamination on substrates in a plasma processing chamber. In one implementation, the apparatus for reduced particle contamination includes a chamber body, and a lid coupled to the chamber body. The chamber body and the lid define a processing volume therebetween. The apparatus also includes a substrate support disposed in the processing volume and an edge ring. The edge ring includes an inner lip disposed over a substrate, a top surface connected to the inner lip, a bottom surface opposite the top surface and extending radially outward from the substrate support, and an inner step between the bottom surface and the inner lip.

In another implementation, a plasma processing apparatus is disclosed and includes a chamber body and a lid coupled to the chamber body. The chamber body and the lid define a processing volume therebetween. The plasma processing apparatus further includes a substrate support disposed in the processing volume and an edge ring disposed on the substrate support. The edge ring includes an inner lip extending radially inward and a top surface connected to the inner lip. The top surface of the edge ring is inclined. The edge ring also includes a bottom surface opposite the top surface and extending radially outward from the substrate support and an inner step between the bottom surface and the inner lip disposed on the substrate support.

In yet another implementation, a plasma processing apparatus is disclosed and includes a chamber body and a lid coupled to the chamber body. The chamber body and the lid define a processing volume therebetween. The plasma processing apparatus also includes a substrate support disposed in the processing volume and an edge ring disposed on the substrate support. The edge ring includes an inner lip extending radially inward and a top surface connected to the inner lip. The top surface of the edge ring is chamfered. The edge ring also includes a bottom surface opposite the top surface and extending radially outward from the substrate support and an inner step between the bottom surface and the inner lip disposed on the substrate support.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of scope, as the disclosure may admit to other equally effective implementations.

Figure 1:
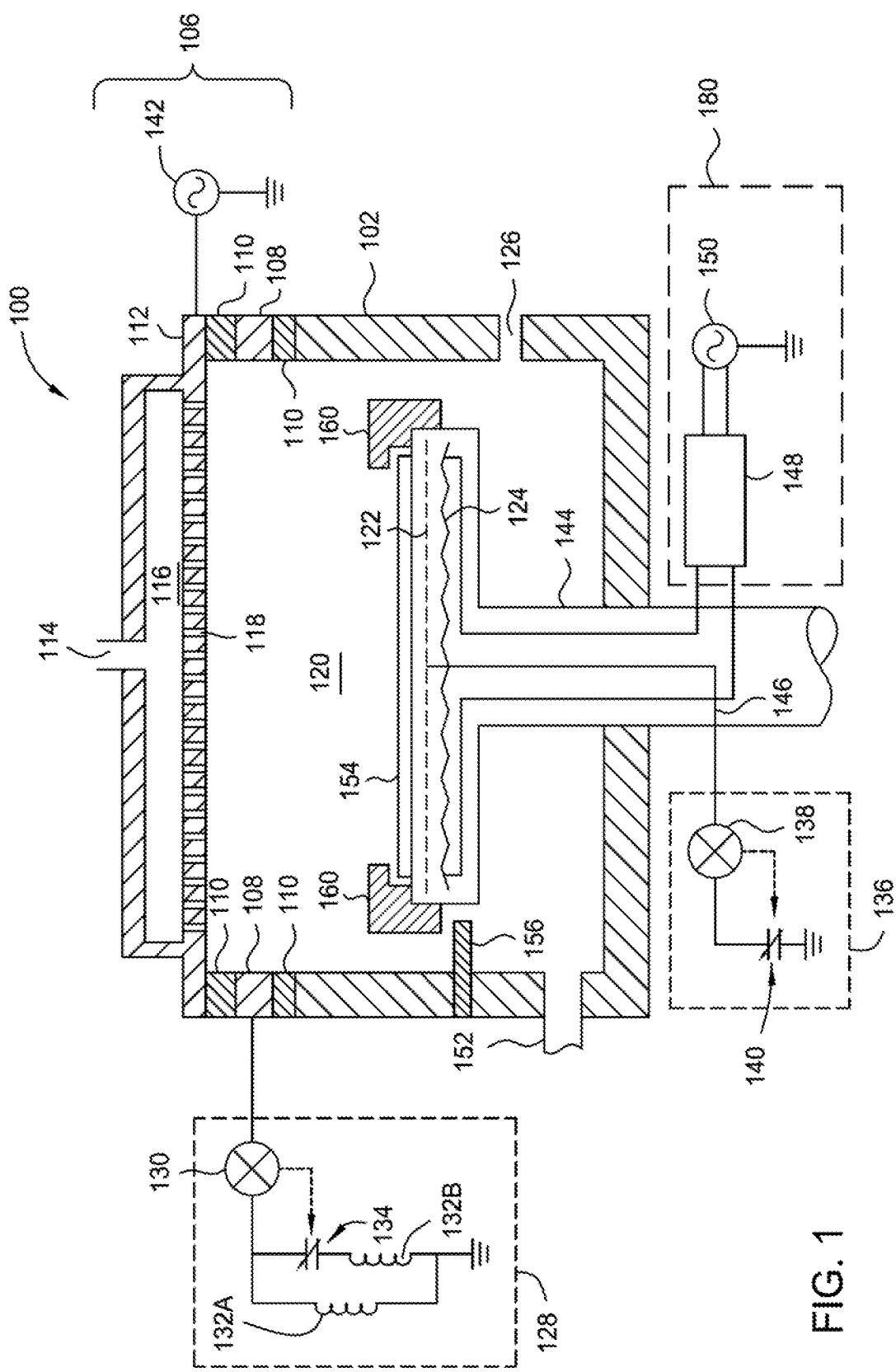
FIG. 1 shows a schematic cross-sectional view of a plasma processing chamber according to one implementation described herein.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

FIG. 1 shows a schematic cross-sectional view of a plasma processing chamber 100 according to one implementation described herein. The processing chamber 100 may be a plasma enhanced chemical vapor deposition (PECVD) chamber or other plasma enhanced processing chamber. An exemplary processing chamber which may benefit from the implementations described herein is the PRODUCER® series of PECVD enabled chambers, available from Applied Materials, Inc., Santa Clara, Calif. It is contemplated that other similarly equipped processing chambers from other manufacturers may also benefit from the implementations described herein. The processing chamber 100 features a chamber body 102, a substrate support 104 disposed inside the chamber body 102, and a lid assembly 106 coupled to the chamber body 102 and enclosing the substrate support 104 in an internal processing volume 120. Substrates 154 are provided to the processing volume 120 through an opening 126.

An electrode 108 may be disposed adjacent to the chamber body 102 and separating the chamber body 102 from other components of the lid assembly 106. The electrode 108 may be part of the lid assembly 106, or may be a separate side wall electrode. The electrode 108 may be an annular, or ring-like member, and may be a ring electrode. The electrode 108 may be a continuous loop around a circumference of the processing chamber 100 surrounding the processing volume 120, or may be discontinuous at selected locations if desired. The electrode 108 may also be a perforated electrode, such as a perforated ring or a mesh electrode. The electrode 108 may also be a plate electrode, for example, a secondary gas distributor.

An isolator 110 contacts the electrode 108 and separates the electrode 108 electrically and thermally from a gas distributor 112 and from the chamber body 102. The isolator 110 may be made from or contain one or more dielectric materials. Exemplary dielectric materials can be or include one or more ceramics, metal oxides, metal nitrides, metal oxynitrides, silicon oxides, silicates, or any combination thereof. For example, the isolator 110 may contain or be formed from aluminum oxide, aluminum nitride, aluminum oxynitride, or any combination thereof. The gas distributor 112 features openings 118 for admitting process gas into the processing volume 120. The process gases may be supplied to the processing chamber 100 via a conduit 114, and the process gases may enter a gas mixing region 116 prior to flowing through the openings 118. The gas distributor 112 may be coupled to a source of electric power 142, such as an RF generator. DC power, pulsed DC power, and pulsed RF power may also be used.

The electrode 108 may be coupled to a tuning circuit 128 that controls a ground pathway of the processing chamber 100. The tuning circuit 128 comprises an electronic sensor 130 and an electronic controller 134, which may be a variable capacitor. The tuning circuit 128 may be an LLC circuit comprising one or more inductors 132. The tuning circuit 128 features a first inductor 132A in series with the electronic controller 134 and a second inductor 132B in parallel with the electronic controller 134. The electronic sensor 130 may be a voltage or current sensor, and may be coupled to the electronic controller 134 to afford a degree of closed-loop control of plasma conditions inside the processing volume 120.

A second electrode 122 may be coupled to the substrate support 104. The second electrode 122 may be embedded within the substrate support 104 or coupled to a surface of the substrate support 104. The second electrode 122 may be a plate, a perforated plate, a mesh, a wire screen, or any other distributed arrangement. The second electrode 122 may be a tuning electrode, and may be coupled to a second tuning circuit 136 by a conduit 146, for example a cable having a selected resistance, such as about 50Ω, disposed in a shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode and/or an electrostatic chucking electrode, may be coupled to the substrate support 104. The third electrode 124 may be coupled to a second source of electric power 150 through a filter 148 contained in an electric circuit 180. The filter 148 may be an impedance matching circuit. The second source of electric power 150 may be DC power, pulsed DC power, RF power, pulsed RF power, or any combination thereof.

The lid assembly 106 and substrate support 104 of FIG. 1 may be used with any processing chamber for plasma or thermal processing. Chambers from other manufacturers may also be used with the components described above.

The substrate support 104 may contain or be formed from one or more metallic or ceramic materials. Exemplary metallic or ceramic materials can be or include one or more metals, metal oxides, metal nitrides, metal oxynitrides, or any combination thereof. For example, the substrate support 104 may contain or be formed from aluminum, aluminum oxide, aluminum nitride, aluminum oxynitride, or any combination thereof. In one implementation, the surface of the substrate support 104 may be configured to support an edge ring 160 during processing.

In another implementation, the inner diameter of the edge ring 160 may be greater than the outer diameter of the substrate 154. In such an implementation, one, two, three, four, or more holders 156 (one holder is depicted in the view of FIG. 1) may be configured to support the edge ring 160 when transferring the substrate 154 to and from the substrate support 104. Multiple holders 156 may be located on the inner wall of the chamber body 102 at locations spaced away from each other. In one or more embodiments, the substrate support 104 is lowered to align with the opening 126. As the substrate support 104 is being lowered towards the opening 106, the edge ring 160 makes contact to and is supported by the holders 156. Once the substrate support 104 is aligned with the opening 126, the substrate 154 can be transferred to or from the substrate support 104 via the opening 126 when introducing or removing the substrate 154 into the processing chamber 100. As the substrate support 104 is being raised away from the opening 126, the substrate support 104 makes contact to and supports the edge ring 160 which is lifted from the holders 156. Once in position for processing, the substrate support 104 maintains support of the edge ring 160.

The edge ring 160 may be formed from one or more ceramic materials and may have an annular shape. In one or more examples, each of the substrate support 104 and the edge ring 160 independently includes one or more ceramic materials. The edge ring 160 may be configured to engage the substrate support 104, in some cases resting directly on the substrate support 104. In one implementation, the substrate support 104 may have an annular ledge formed along the circumference of the substrate supporting surface. The annular ledge may be configured to couple to and support the edge ring 160, for example with the edge ring 160 resting on the annular ledge, when the substrate support 104 is in the processing position.

The edge ring 160 may be sized to extend radially outward from the substrate support 104. As such, an outer diameter of the edge ring 160 may be greater than an outer diameter of the substrate support 104. Thus, a portion of the bottom surface of the edge ring 160 which extends radially beyond the substrate support 104 may be configured to engage the holder 156. The holder 156 may be a continuous or discontinuous annular shelf extending from a chamber side wall or liner radially inward towards the substrate support. In one implementation, the holder 156 may be three protrusions distributed, equally or unequally, around the processing chamber 100 at a peripheral portion thereof. In another implementation, the protrusions may be more than three protrusions, which may be distributed equally, unequally, and/or symmetrically around the processing chamber 100 periphery. The holder 156 may have a support surface that is substantially parallel to a contact surface of the edge ring 160. Alternately, the holder 156 may have a support surface that is not parallel to the contact surface of the edge ring. For example, in some cases, the holder 156 may have a downward sloping support surface to reduce areal contact between the holder 156 and the edge ring 160. In operation, the holder 156 engages the edge ring 160 to hold the edge ring 160 away from the substrate 154 while the substrate 154 is removed from the processing chamber 100.

The edge ring 160 may contain or be formed from one or more ceramic materials. In one implementation, the edge ring 160 is formed from or contains aluminum nitride. The edge ring 160 may include an inner lip that extends over and above the substrate 154. In one implementation, the inner lip may have a curved or rounded edge. In another implementation, the inner lip may have a flat vertical inner wall.

Figure 2:
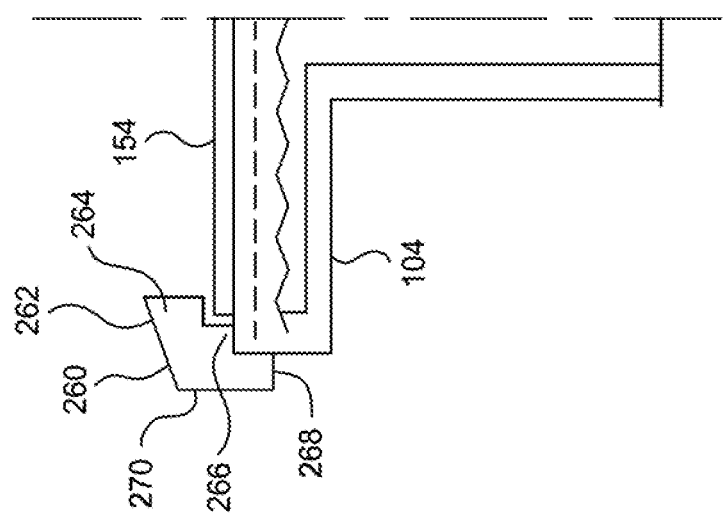
FIG. 2 shows a partial cross-sectional view of an edge ring according to one implementation described herein.

In one implementation, the edge ring 160 is an annular ring with a flat top surface. In the implementation of FIG. 2, the edge ring 260 is an annular ring with an inclined top surface 262. FIG. 2 shows a partial cross-sectional view of an edge ring according to one implementation described herein. The edge ring 260 can be utilized in the processing chamber 100. The edge ring 260 is an annular ring with an inclined top surface 262 that is higher towards the inner circumference and lower towards the outer circumference. The inclined top surface 262 may be a beveled surface. In other words, the inclined top surface 262 decreases radially outward. The edge ring 260 includes an inner lip 264. The inclined top surface 262 is in connection with and part of the inner lip 264. The inner lip 264 extends radially outward towards the inner circumference of the edge ring 260. The inner lip 264 may have a flat, vertical inner wall. The inner lip 264 extends over and above the substrate 154. The inner lip 264 is in connection with an inner step 266. The inner step 266 is a right angled protrusion. The inner step 266 is located below the inner lip 264 and radially in from the inner lip 264. The inner step 266 has a bottom surface that engages the substrate support 104. The inner step 266 is in connection with a bottom surface 268 and the inner lip 264. The bottom surface 268 is opposite the inclined top surface 262 and connected to the inclined top surface 262 by a vertical wall 270. The bottom surface 268 extends radially outward from the substrate support 104 and is configured to engage the holder 156.

Figure 3:
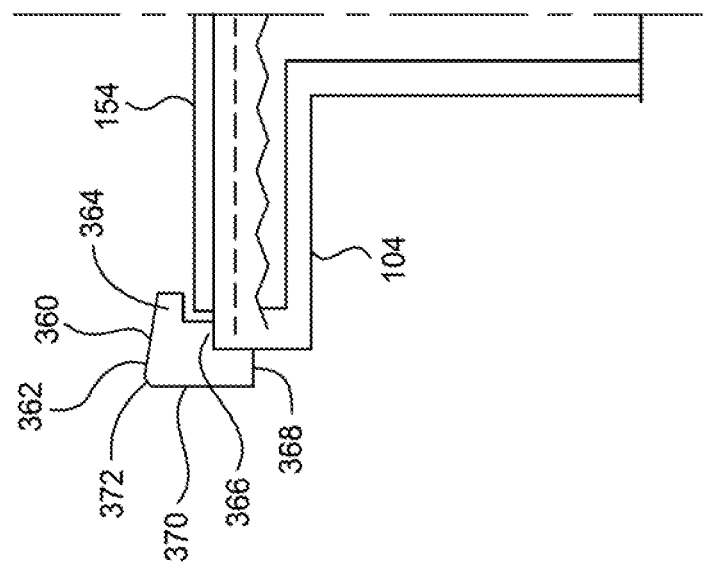
FIG. 3 shows a partial cross-sectional view of an edge ring according to another implementation described herein.

FIG. 3 shows a partial cross-sectional view of an edge ring according to another implementation described herein. In the implementation of FIG. 3, the edge ring 360 is an annular ring with an inclined top surface 362. The edge ring 360 can be utilized in the processing chamber 100. The edge ring 360 is similar to the edge ring 260 including an inner lip 364, an inner step 366, a bottom surface 368, and a vertical wall 370. The edge ring 360 is an annular ring with an inclined top surface 362 that is lower towards the inner circumference and higher towards the outer circumference. In other words, the inclined top surface 362 increases in height radially outward. The inclined top surface 362 may be a beveled surface. In one implementation the inclined top surface 362 includes a chamfered edge 372. In another implementation, the inclined top surface 362 has rounded edges.

In operation, plasma is generated in the processing volume 120. Upon energizing a plasma in the processing volume 120, a potential difference is established between the plasma and the first electrode 108. A potential difference is also established between the plasma and the second electrode 122. The plasma thus formed can produce particles in the reactive zone of the plasma. The particles typically remain electrostatically charged while the plasma is energized, so the particles remain mostly trapped within the plasma sheath. To avoid depositing the particles on the substrate being processed when the plasma is de-energized, the edge ring 160 shifts the high plasma density zone away from the edge area of the substrate. The elevation of the edge ring 160 from the substrate support 104 pushes the particles away from the substrate 154 towards an exhaust 152. Additionally, a potential difference may be established between the plasma and the edge ring 160 repelling the charged particles away from the substrate 154.

The edge ring also provides for more control of the plasma density near the substrates edge reducing edge spray defects during plasma termination. In certain implementations, the edge ring provides a surface to protect the substrate from falling particles but also to direct the particles away from the substrate. The plasma particles are instead directed towards the exhaust and away from the substrate.

While the foregoing is directed to implementations of the present disclosure, other and further implementations of the disclosure may be devised without departing from the basic scope thereof.

The invention claimed is:

1. An edge ring, comprising:
   a top surface;
   a bottom surface opposite the top surface and extending radially outward;
   an outer vertical wall extending between and connected to the top surface and the bottom surface;
   an inner vertical wall opposite the outer vertical wall;
   an inner lip extending radially inward from the inner vertical wall; and
   an inner step disposed between and connected to the inner wall and the bottom surface, wherein:
      the inner step has a first surface adjacent a second surface,
      the first surface is configured to be in contact with a top surface of a substrate support and the second surface is configured to be in contact with a side surface of the substrate support, and
      the inner lip is configured to extend over a substrate disposed on the substrate support.

2. The edge ring of claim 1, wherein the inner lip extends at a right angle relative to the inner vertical wall.

3. The edge ring of claim 1, wherein the top surface of the edge ring is inclined.

4. The edge ring of claim 1, wherein the top surface of the edge ring is inclined higher towards the inner circumference of the edge ring and lower towards the outer circumference of the edge ring.

5. The edge ring of claim 1, wherein the top surface of the edge ring is inclined lower towards the inner circumference of the edge ring and higher towards the outer circumference of the edge ring.

6. The edge ring of claim 1, wherein the top surface of the edge ring is flat.

7. The edge ring of claim 1, wherein the edge ring has rounded edges.

8. The edge ring of claim 1, wherein the top surface of the edge ring is chamfered.

9. The edge ring of claim 1, wherein the edge ring comprises a ceramic material.

10. The edge ring of claim 1, wherein the edge ring comprises aluminum.

11. An edge ring, comprising:
    a top surface;
    a bottom surface opposite the top surface and extending radially outward;
    an outer vertical wall extending between and connected to the top surface and the bottom surface;
    an inner vertical wall opposite the outer vertical wall;

an inner lip extending radially inward from the inner vertical wall, wherein the inner lip extends at a right angle relative to the inner vertical wall; and an inner step disposed between and connected to the inner wall and the bottom surface, wherein:

the inner step has a first surface adjacent a second surface, the first surface is configured to be in contact with a top surface of a substrate support and the second surface is configured to be in contact with a side surface of the substrate support, and the inner lip is configured to extend over a substrate disposed on the substrate support.

12. The edge ring of claim 11, wherein the top surface of the edge ring is inclined.

13. The edge ring of claim 11, wherein the top surface of the edge ring is inclined higher towards the inner circumference of the edge ring and lower towards the outer circumference of the edge ring.

14. The edge ring of claim 11, wherein the top surface of the edge ring is inclined lower towards the inner circumference of the edge ring and higher towards the outer circumference of the edge ring.

15. The edge ring of claim 11, wherein the top surface of the edge ring is flat.

16. The edge ring of claim 11, wherein the edge ring has rounded edges.

17. The edge ring of claim 11, wherein the top surface of the edge ring is chamfered.

18. The edge ring of claim 11, wherein the edge ring comprises a ceramic material.

19. The edge ring of claim 11, wherein the edge ring comprises aluminum.

20. An edge ring, comprising:

a top surface;

a bottom surface opposite the top surface and extending radially outward;

an outer vertical wall extending between and connected to the top surface and the bottom surface;

an inner vertical wall opposite the outer vertical wall;

an inner lip extending radially inward from the inner vertical wall, wherein the inner lip extends at a right angle relative to the inner vertical wall; and an inner step disposed between and connected to the inner wall and the bottom surface, wherein:

the inner step has a first surface adjacent a second surface, the first surface is configured to be in contact with a top surface of a substrate support and the second surface is configured to be in contact with a side surface of the substrate support, and the inner lip is configured to extend over a substrate disposed on the substrate support; and wherein the edge ring comprises a ceramic material.

* * * * *